United States Patent [19]

Takahashi et al.

[11] Patent Number: 4,982,151
[45] Date of Patent: Jan. 1, 1991

[54] VOLTAGE MEASURING APPARATUS

[75] Inventors: Hironori Takahashi; Shinichiro Aoshima; Yutaka Tsuchiya, all of Shizuoka, Japan

[73] Assignee: Hamamatsu Photonics Kabushiki Kaisha, Shizuoka, Japan

[21] Appl. No.: 390,768

[22] Filed: Aug. 8, 1989

[30] Foreign Application Priority Data

Oct. 5, 1988 [JP] Japan ................... 63-251532

[51] Int. Cl.⁵ .............. G01R 31/00; G01R 19/00
[52] U.S. Cl. .................... 324/96; 324/77 K; 324/98; 250/225; 350/374
[58] Field of Search ............. 324/98, 99 R, 99, 96, 324/77 R; 350/356, 374–378; 250/225

[56] References Cited

U.S. PATENT DOCUMENTS

| | | | |
|---|---|---|---|
| 3,419,802 | 12/1968 | Pelenc et al. | 324/96 |
| 3,419,803 | 12/1968 | Pelenc et al. | 324/96 |
| 4,446,425 | 5/1984 | Valdmanis et al. | |
| 4,603,293 | 7/1986 | Mourou et al. | |
| 4,618,819 | 10/1986 | Mourou et al. | 324/96 |
| 4,857,836 | 8/1989 | Soelkner | 324/96 |
| 4,864,222 | 9/1989 | Aoshima et al. | 324/96 |

FOREIGN PATENT DOCUMENTS

| | | | |
|---|---|---|---|
| 0197196 | 10/1986 | European Pat. Off. | 324/96 |
| 0293842 | 12/1988 | European Pat. Off. | |
| 0146858 | 9/1983 | Japan | |
| 0166873 | 9/1984 | Japan | 324/96 |

OTHER PUBLICATIONS

"Electro-Optic Sampling: Testing Picosecond Electronics", by Valdmanis et al., *Laser Focus/Electro-Optics*, 2/86, pp. 84–96, ch. 324/96.
Valdmanis, J. A. et al., "Subpicosecond Electrooptic Sampling: Principles and Applications", *IEEE Journal of Quantum Electronics*, vol. QE-22, No. 1, Jan. 1986, pp. 69–78.
Valdmanis, J. A., *CLEO '87*, pp. 352–353.
LLE Review Quarterly Report, Jul.–Sep. 1987, pp. 158–163.
"Picosecond Electro-Electron Optic Oscilloscope", *Proc. Conf. Picosecond Electron. Optoelectron,* (N.Y. Springer-Verlag, 1985), pp. 58–61.

Primary Examiner—Ernest F. Karlsen
Assistant Examiner—William J. Burns
Attorney, Agent, or Firm—Finnegan, Henderson, Farabow, Garrett, and Dunner

[57] ABSTRACT

A voltage measuring apparatus comprises an optical probe furnished with an electro-optic material whose refractive index is changed in accordance with a voltage developing in a given part of an object and an auxiliary electrode for terminating electric lines of force coming from the given part, a light source for producing light to be inputted to the electro-optic material, a light polarization detector for detecting a polarization state of output light from the electro-optic material, and a power source for applying a variable voltage to the auxiliary electrode. An absolute value of the voltage in the given part can be determined as a specific value of the variable voltage obtained when no change is detected in the polarization state of the output light.

10 Claims, 9 Drawing Sheets

VOLTAGE MEASURING APPARATUS

BACKGROUND OF THE INVENTION

The present invention relates to an apparatus for measuring the voltage of an object of interest using an optical probe furnished with an electro-optic material which exhibits the electro-optic effect.

Apparatus have been known that measure the voltage at a given part of an object of interest such as an integrated circuit using an optical probe furnished with an electro-optic material such as $LiTaO_3$ which exhibits the electro-optic effect (see, for example, U.S. Pat. No. 4,446,425 issued May 1, 1984; IEEE Journal of Quantum Electronics, Vol. QE-22, No. 1, pp. 69–78, published January 1986; J. A. Valdmanis, CLEO '78, pp. 352–353, published 1987; and LLE Review, July–September, pp. 158–163, published 1987).

FIGS. 10 and 11 show the principle for the method of voltage measurement described in these references. An optical probe 50 (or 60) shown in FIG. 10 (or 11) uses an electro-optic material 52 (or 62) cut out in such a way that the Z-axis of the crystal is parallel to the bottom end face 51 (or 61). In the system shown in FIG. 10, the bottom end face 51 of the electro-optic material 52 is further furnished with a total reflection mirror 53 formed of a dielectric multilayer film.

An object of interest 70 has both an electrode 71 for developing the voltage to be measured and an electrode (e.g. ground electrode) 72 for terminating the electric field lines coming from the electrode 71. In order to measure the voltage of the electrode 71 on the object 70, the optical probe 50 (or 60) is positioned as shown in FIG. 10 (or 11) and in such a way that the Z-axis of the electro-optic material 52 (or 62) will lie parallel to the line joining the electrodes 71 and 72. This arrangement enables detecting the intensity of an electric field (electric field lines) acting in a direction horizontal to the surface of the object 70. The refractive index of the electro-optic material 52 (or 62) varies in accordance with the intensity of a horizontal field, so in the case shown in FIG. 10, an incident light beam $I_1$ that is launched along the central axial line B-B of the optical probe 50 is reflected from the total reflecting mirror 53; and in the case shown in FIG. 11, the incident light beam $I_1$ is totally refracted three times by the inside surfaces of the optical probe 60. By extracting the change in the state of polarization of the light beam $R_1$ emerging from each probe, the strength of the horizontal field is detected so as to measure the voltage developing at the electrode 71.

The prior art voltage measuring apparatus which employs the optical groove 50 or 60, however, has had the problem that theoretically it is only capable of measuring the field strength between the two electrodes 71 and 72 on the object 70, rather than the absolute voltage developing at the electrode 71.

SUMMARY OF THE INVENTION

An object, therefore, of the present invention is to provide an apparatus that is capable of measuring the absolute voltage at a given part of an object of interest.

This object of the present invention can be attained by a voltage measuring apparatus that comprises an optical probe furnished with an electro-optic material which exhibits the electro-optic effect, a light source that outputs a light beam to be launched into the electro-optic material in the optical probe, light detecting means for detecting the state of polarization of the light beam emerging from the electro-optic material, and voltage applying means or outputting a variable voltage. According to the resent invention, in order to measure the absolute voltage of a given part, the optical probe is furnished with an auxiliary electrode which is supplied with a variable voltage from said voltage applying means.

In a preferred embodiment, this auxiliary electrode is transparent and disposed on the surface of the electro-optic material in a face-to-face relationship with the tip face of the optical probe.

In another preferred embodiment, the auxiliary electrode may be disposed on the lateral side of the optical probe in proximity to the top end face of the electro-optic material.

In still another embodiment, a pulse light source is used and combined with a photodetector such as a photodiode.

If desired, a CW light source or a pulse light source is used and combined with a high-speed light response detector such as a streak camera which is used as the light detecting means.

In a further embodiment, the voltage applying means is composed of a power source for generating a variable voltage and a voltmeter for detecting the generated variable voltage.

In the voltage measuring apparatus of the present invention, the optical probe is positioned in proximity to the top of that part of an object of interest whose voltage is to be measured. With the probe positioned in this way and if the voltage applied to the auxiliary electrode which is disposed on the top end face of the electro-optic material or on the lateral side of the optical probe is "zero", most of the electric lines of force coming from the specified part of the object of interest will be directed to the auxiliary electrode as they pass through the electro-optic material along paths that are substantially parallel to the central axial line of the optical probe. As a result, a change in a refractive index will occur within the electro-optic material in an amount that is proportional to the voltage developing at that specified part. This change causes a variation in the state of polarization of a light beam that has been emitted from the light source and launched into the electro-optic material. The so affected light beam emerges from the electro-optic material to be picked up by the light detecting means which is capable of detecting the change in the state of light polarization. If a pulse light source is used and combined with a photodetector such as a high-speed photodiode, the change in the state of light polarization can be detected with high temporal resolution by sampling the voltage of the specified part with a light beam incident on the electro-optic material. If a CW light source or a pulse light source is used and combined with a high-speed light response detector such as a streak camera which is used as the light detecting means, the change in the state of light polarization can be detected with high temporal resolution by measuring the intensity of the output light beam from the electro-optic material.

If the voltage applied from the voltage applying means is then increased gradually, the potential difference from the voltage developing at the specified part of the object of interest decreases, so that the change in the refractive index of the electro-optic material will become small and the change in the state of polarization of light beam will accordingly diminish. When it becomes no longer possible for the light detecting means to detect any change in the state of light polarization, it is considered that the voltage applied from the voltage applying means has become equal to the voltage developing at the specified part of the object of interest, and the absolute voltage of that specified part can be determined by detecting the applied voltage with a voltmeter.

DESCRIPTION OF THE PREFERRED EMBODIMENTS

Several embodiments of the present invention are described hereinafter with reference to the accompanying drawings.

Figure 1:
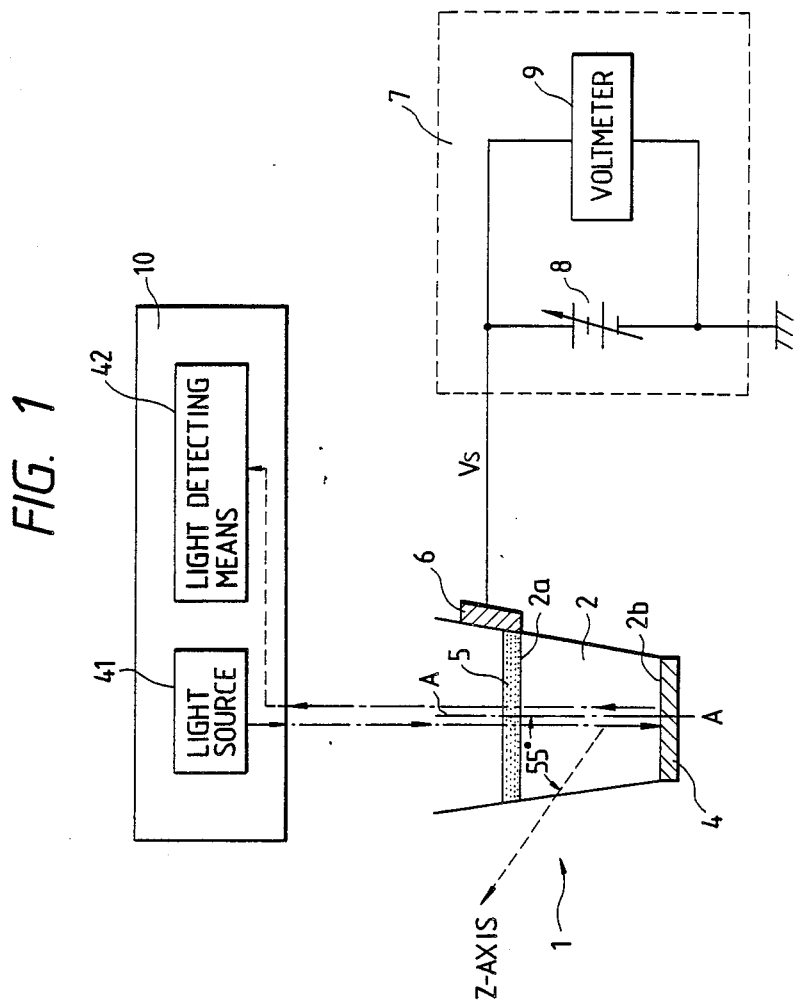
FIG. 1 shows schematically a voltage measuring apparatus according to a first embodiment of the present invention.

FIG. 1 shows schematically a voltage measuring apparatus according to a first embodiment of the present invention. An optical probe 1 is furnished with an electro-optic material 2 such as $LiTaO_3$ and $LiNbO_3$ which exhibit the electro-optic effect. The electro-optic material 2 has been cut out in such a way that its top and bottom end faces 2a and 2b lie perpendicular to a direction inclined 55° from the Z-axis and is disposed in such a way that the faces 2a and 2b will lie perpendicular to the central axial line A—A of the probe 1. The bottom end face 2b of the electro-optic material 2 is furnished with a total refraction mirror 4 formed of a dielectric multilayer film or the like. The top end face 2a of the electro-optic material 2 is furnished with an auxiliary electrode 5. The auxiliary electrode 5 is transparent and supplied with a voltage $V_s$ from a voltage applying unit 7 via an external electrode 6 attached to the lateral side of the probe 1. The voltage applying unit 7 is composed of a power source 8 that generates a variable voltage $V_s$ and a voltmeter 9 for detecting the generated voltage $V_s$. The voltage measuring apparatus shown in FIG. 1 also includes a unit 10 that has a light source 41 for outputting a light beam $I_o$ to be launched into the electro-optic material 2 in the probe 1 and light detecting means 42 for detecting the change in the state of polarization cf a light beam $R_o$ emerging from the electro-optic material 2.

The procedures of operation involved in measuring the voltage of an object such as an integrated circuit with the apparatus shown FIG. 1 are described below.

Figure 2A:
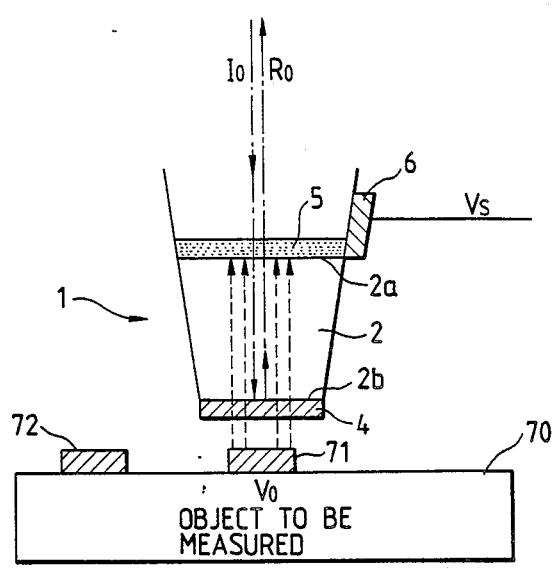
FIGS. 2A and 2B illustrate how the voltage at a specified electrode on an object of interest that additionally has an electrode for terminating the electric field lines from said first electrode is measured with the apparatus shown in FIG. 1.
Figure 2B:
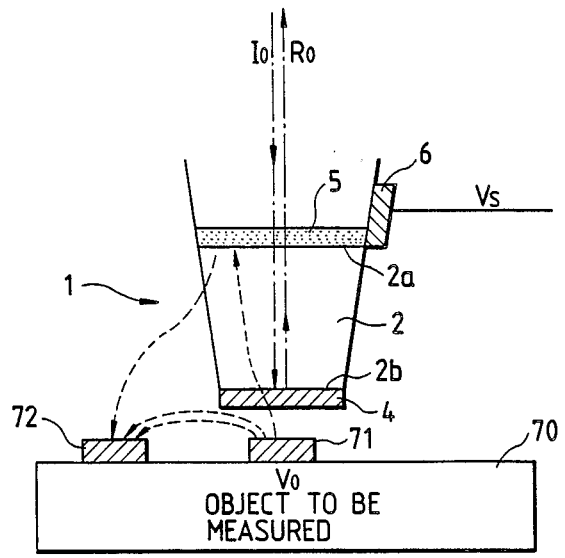

FIGS. 2A and 2B refer to the case where the object of interest 70 has not only an electrode 71 that develops a voltage to be measured but also an electrode (e.g. ground electrode) 72 for terminating the electric field lines from the electrode 71 and they illustrate how the voltage $V_o$ at the electrode 71 is measured. The measurement starts with positioning the optical probe 1 in such a way that its tip will lie above and in proximity to the electrode 71. Alternatively, the tip of the probe 1 may contact the electrode 71. Then the voltage $V_s$ from the voltage applying unit 7 is initially set to "zero" so that the auxiliary electrode 5 on the probe 1 will be connected to the ground potential. This state is shown in FIG. 2A and most of the electric lines of force produced by $V_o$ at the electrode 71 are directed to the auxiliary electrode 5 as they pass through the electro-optic material 2 in a direction generally parallel to the central axial line A—A of the probe 1. As a result, a change in the refractive index occurs within the electro-optic material 2 in an amount that is proportional to the voltage $V_o$. A light beam $I_o$ from the light source 41 travels through the electro-optic material 2 along its central axial line A—A past the transparent auxiliary electrode 5. In the electro-optic material 2, the state of polarization of $I_o$ will be modulated, or altered in accordance with the change in the refractive index, and after being reflected from mirror 4, the light will emerge from the electro-optic material 2. The output light beam $R_o$ from the electro-optic material 2 passes through the auxiliary electrode 5 and is picked up by the light detecting means 42 which detects the outcome of the modulation, or the change in the state of light polarization.

In the next step, the voltage $V_s$ from the voltage applying unit 7 is gradually increased from the level of "zero". Since the potential difference "$V_o$-$V_s$", or the difference between the voltage $V_o$ at the electrode 71 on the object 70 and the voltage $V_s$, will decrease accordingly, part of the electric lines of force coming from the electrode 71 will become directed to the other electrode 72, causing a decrease in the strength of the electric field in the electro-optic material 2. As a consequence, the change in the refractive index of the electro-optic material 2 will decrease, and the change in the state of polarization of light beam $R_o$ will also become small. When the voltage $V_s$ is gradually increased and if it becomes no longer possible for the light detecting means 42 to detect the change in the state of polarization of light beam $R_o$, one may conclude that the voltage $V_s$ from the voltage applying means 7 has become equal to the voltage $V_o$ on the electrode 71. Thus, by detecting the relevant value of $V_s$ with the voltmeter 9, the absolute vol&age $V_o$ on the electrode 71 can be determined.

The electro-optic material 2 has been cut out in such a way that its top and bottom end faces 2a and 2b will lie perpendicular to a direction inclined 55° from the Z-axis, so that the change in the state of polarization of light beam $I_o$ launched into the electro-optic material 2 along the central axial line A—A of the probe 1 can be maximized to increase the sensitivity with which the change in the state of polarization is detected, and this allows precise detection of the absolute voltage $V_o$.

Figure 3A:
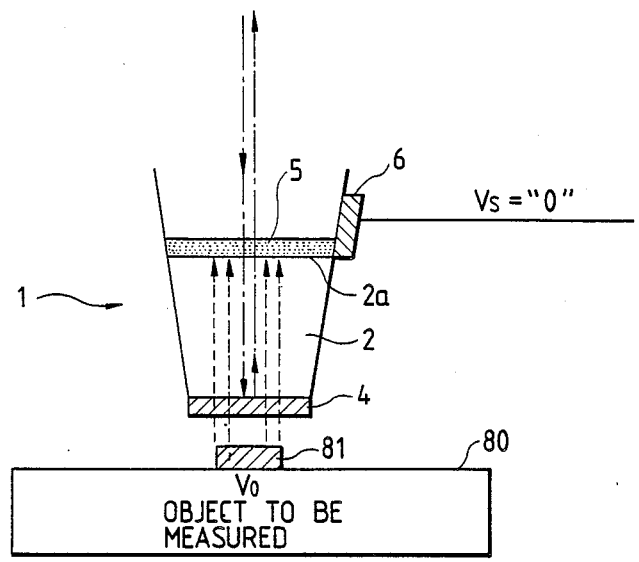
FIGS. 3A and 3B illustrate how the apparatus shown in FIG. 1 is operated when an object of interest has an electrode alone that develops the voltage to be measured.
Figure 3B:
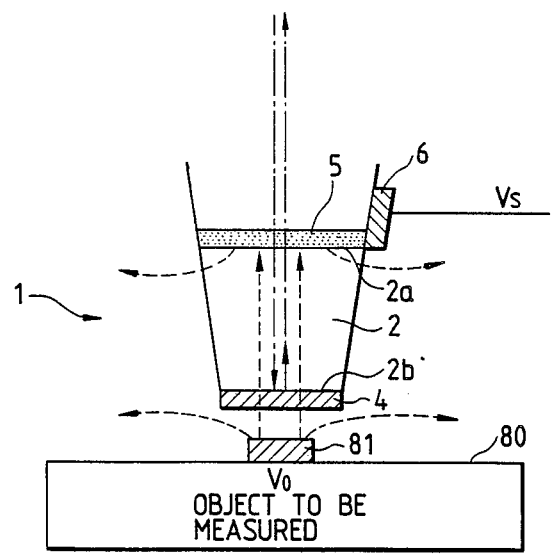

FIGS. 2A and 2B refer to the case where the object 70 has the electrode 72 for terminating the electric lines of force from the electrode 71. It should, however, be noted that the voltage measuring apparatus according to the first embodiment is also capable of measuring the absolute voltage at a specified part of an object that does not have an electrode corresponding to the electrode 72. FIGS. 3A and 3B refer to the case where an object of interest 80 has only an electrode 81 that develops the voltage to be measured and they illustrate how a voltage $V_o$ at the electrode 81 is measured. As in the case shown in FIGS. 2A and 2B, the measurement starts with positioning the optical probe 1 in such a way that its tip will lie above and in proximity to the electrode 81, and then a voltage $V_s$ is initially set to "zero", as shown in FIG. 3A. Most of electric lines of force produced by $V_o$ on the electrode 81 are directed to an auxiliary electrode 5 as they pass through an electro-optic material 2, creating a change in the refractive index of the electro-optic material 2 in an amount that is proportional to the voltage $V_o$. In response, there occurs a change in the state of polarization of light beam $R_o$. When the voltage $V_s$ is increased from "zero", the field strength, or the intensity of electric lines of force in the electro-optic material 2, will decrease as shown in FIG. 3B. When the voltage $V_s$ becomes equal to $V_o$, it becomes no longer possible to detect any change in the state of polarization of light beam $R_o$. Thus, by detecting the relevant value of the voltage $V_s$, the absolute voltage $V_o$ on the electrode 81 can be determined.

Figure 4:
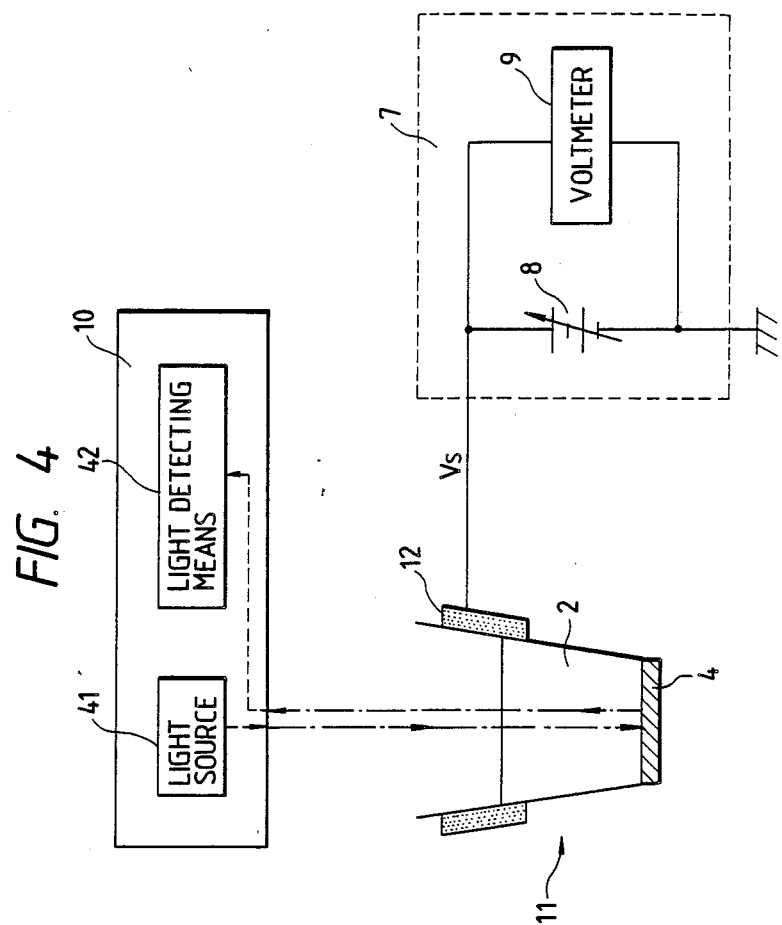
FIG. 4 shows schematically a voltage measuring apparatus according to a second embodiment of the present invention.

FIG. 4 shows schematically a voltage measuring apparatus according to a second embodiment of the present invention, and the parts which are identical to those shown in FIG. 1 are identified by like numerals. In the voltage measuring apparatus shown in FIG. 4, an auxiliary electrode 12 is attached to the lateral side of the optical probe 11 in proximity to the top end face 2a of an electro-optic material 2. The auxiliary electrode 12 is adapted to be supplied with a voltage $V_s$ directly from a voltage applying unit 7. Since the auxiliary electrode 12 is not within the optical probe 11, it does not need to be made of a transparent material. The auxiliary electrode 12 may surround the electro-optic material 2 or it may be attached to only part of the latter.

Even when the auxiliary electrode 12 is disposed in the way described above, the method of voltage measurement will be the same as shown in FIGS. 2A and 2B or FIGS. 3A and 3B: the optical probe 11 is positioned with its tip lying above and in proximity to the electrode 71 (81) on the object 70 (80); a voltage $V_s$ applied to the auxiliary electrode 12 is gradually increased from "zero" until the change in the state of polarization of light beam $R_o$ becomes no longer detectable; and the voltage $V_s$ at that time is detected to determine the absolute voltage $V_o$ at the electrode 71 (81).

Figure 5:
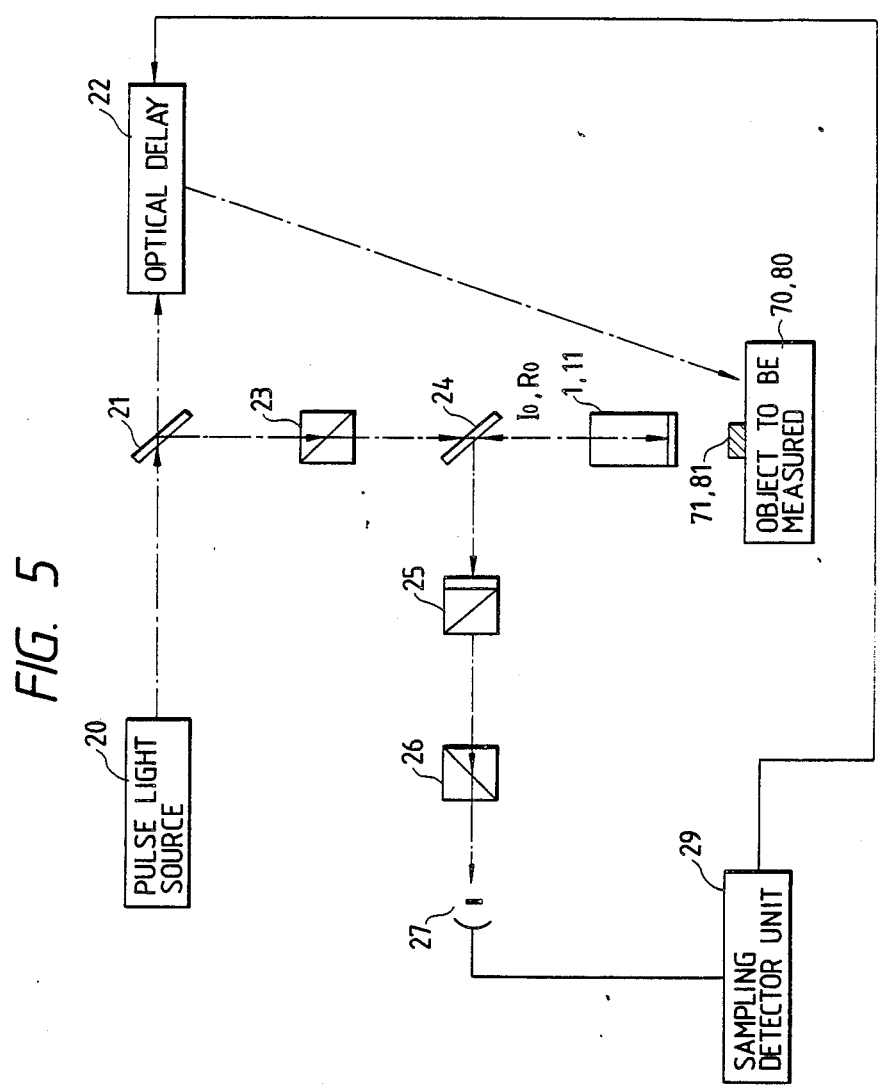
FIGS. 5 to 7 show specific examples of a light source and light detecting means.
Figure 6:
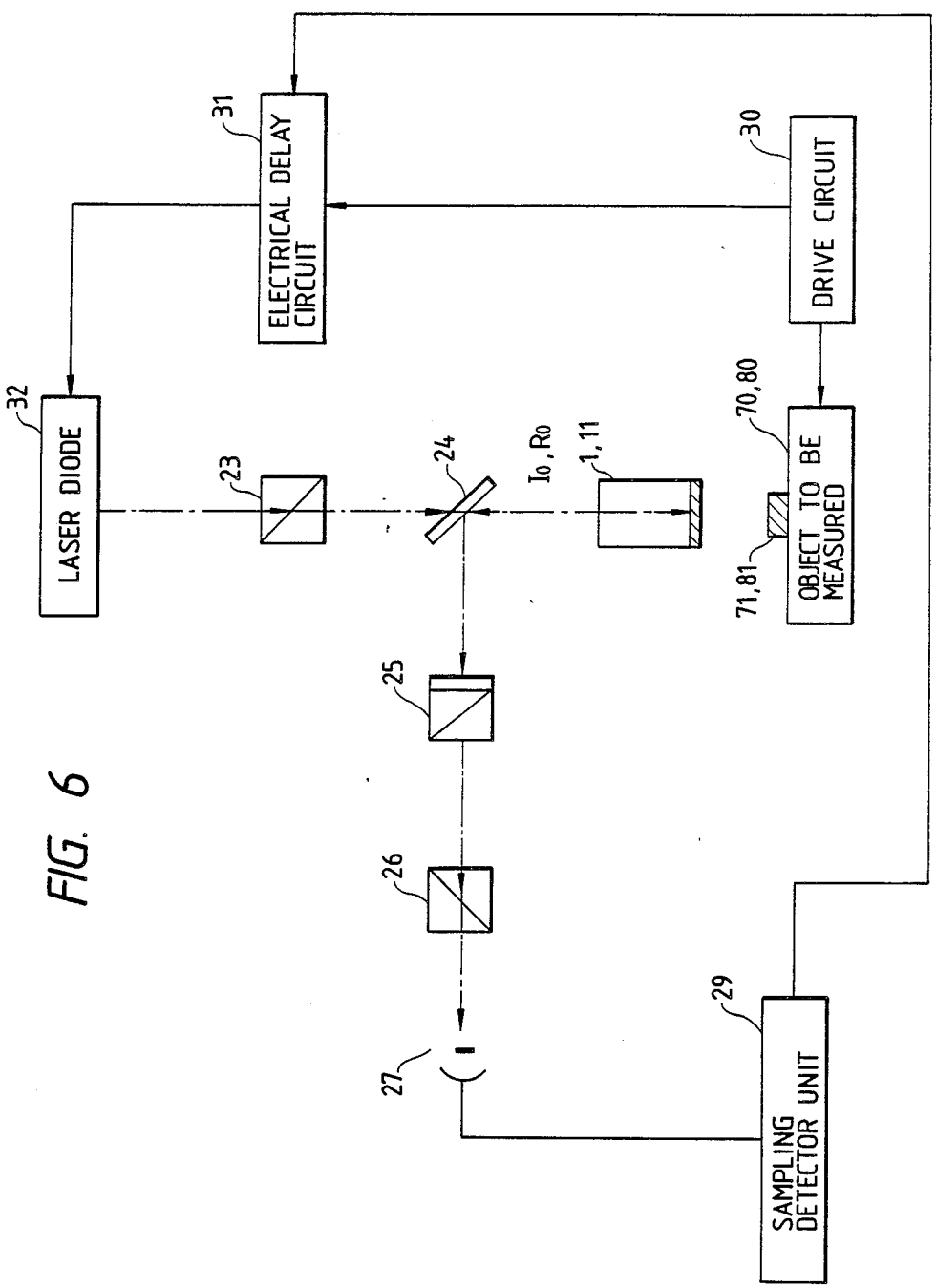
Figure 7:
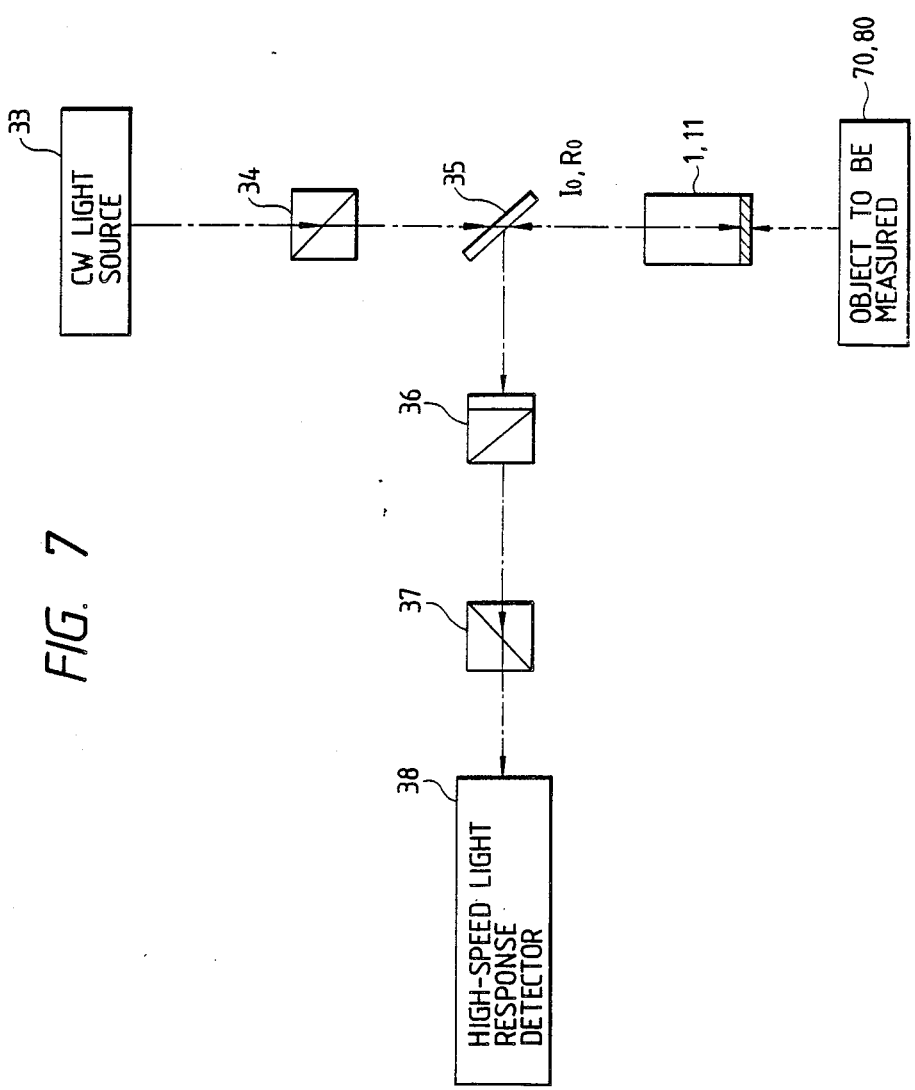

The unit 10 used in the first and second embodiments described above may specifically be composed as shown in FIG. 5, 6 or 7.

The system shown in FIG. 5 is to be applied to the case where an object of interest 70 (80) is driven with a built-in photodetector (not shown) in voltage measurement. Very short pulse light from a pulse light source 20 such as a CPM laser is passed through a half mirror 21 and an optical delay 22 to be launched into the object 70 (80), which is driven in synchronism with the incident very short pulse light. At the same time, the very short pulse light from the pulse light source 20 is passed through a polarizer 23 and a half mirror 24 to be launched as a light beam $I_o$ into an optical probe 1 (11). A light beam $R_o$ emerging from the optical probe 1 (11) is reflected by the half mirror 24 and a Soleil-Babinet compensator plate 25 and launched into an analyzer 26, where a component of a predetermined polarization is extracted. The intensity of the extracted component is detected with an ordinary photodetector 27 such as a photodiode. The result of the detection is displayed on a sampling detector unit 29 after amplification with an amplifier (not shown) or some other means incorporated therein. The sampling detector unit 29 adjusts the optical delay 22 in such a way that a voltage $V_o$ to be measured will be generated at an electrode 71 (81) on the object 70 (80) in synchronism with the launching of light beam $I_o$ into the optical probe 1 (11); with the delay 22 being properly adjusted, the unit 29 samples the result of detection from the photodetector 27 and displays the sampled result as an output of the amplifier. Thus, the change in the state of light polarization can be detected with high temporal resolution, enabling the voltage waveform of the object of interest to be measured and displayed with correspondingly high temporal resolution.

If one wants to measure the absolute value of the voltage $V_o$ at a single point on the voltage waveform of the electrode 71 (81) on the object 70 (80), he may adjust the optical delay 22 to be fixed at the point of measurement and performs the sampling detection. Since the output of the amplifier represents the amount of change in the state of polarization of the light beam $R_o$ emerging from the optical probe 1 (11), the operator may increase slowly the voltage $V_s$ from the voltage applying unit 7 while monitoring the output of the amplifier; when the output of the latter has become zero, he detects the relevant value of $V_s$ so as to determine the absolute value of the voltage $V_o$ at the desired point on the voltage waveform.

In the example shown above, only the absolute value of a voltage at a single point on a voltage waveform can be determined. If the optical delay 22 is operated continuously and the sampling point is shifted from one point to another while the voltage $V_s$ from the voltage applying unit is increased gradually, absolute voltages $V_o$ at respective points of the voltage waveform can be detected successively. Alternatively, if the optical delay 22 is operated continuously and the sampling point is shifted from one point to another while the voltage $V_s$ is fixed to a certain value, points on the voltage waveform which have the voltage $V_s$ are selectively detected. In this case, the apparatus of the invention can be used as a comparator.

If desired, the light travelling from the optical delay 22 to the object 70 (80) is chopped at a selected frequency and a lock-in amplifier is used as the above amplifier to amplify only the signal of said frequency component over a narrow band. This lock-in detection or some other appropriate method may be performed to provide an improved S/N ratio. In this case of using the lock-in amplifier, the voltage $V_s$ should not be a DC voltage, but a rectangular-wave signal which is in synchronism with the chopping and has the frequency of the chopping. The rectangular-wave signal has two levels of zero and $V_s$. The voltage $V_o$ at a desired point on the voltage waveform can be measured by gradually increasing the voltage $V_s$ and identifying the point at which the output from the lock-in amplifier becomes zero.

The system shown in FIG. 6 is operated by the same principle as illustrated in FIG. 5, except that it is applied to the case where an object 70 (80) does not contain a built-in photodetector and that it is driven with an electrical pulse, rather than a light pulse. Thus, in the system shown in FIG. 6, the object 70 (80) is driven with an electrical pulse generated from a drive circuit 30; this electrical pulse is delayed with an electrical delay circuit 31 to drive a laser diode 32 so that it will produce a light pulse. By adjusting the electrical delay circuit 31 with a sampling detector unit 29, the change in the state of light polarization can be detected as with the system shown in FIG. 5.

The lock-in type detection can also be performed in the system shown in FIG. 6. The absolute voltage $V_o$ is measured in the same manner as in the system of FIG. 5 by using a rectangular-wave signal in synchronism with the operation of the drive circuit 30.

In the system shown in FIG. 7, a CW laser beam from a CW light source 33 such as a He-Ne laser is passed through a polarizer 34 and a half mirror 35 to be launched as a light beam $I_o$ into an optical probe 1 (11), and a light beam $R_o$ emerging from the probe 1 (11) is reflected by the half mirror 35 and passed through a Soleil-Babinet compensator plate 36 to be launched into an analyzer 37, which extracts a component of a predetermined polarization. The temporal change in the intensity of the extracted component is detected with a high-speed light response detector 38 such as a streak camera, thereby accomplishing voltage measurement with high temporal resolution.

Figure 8:
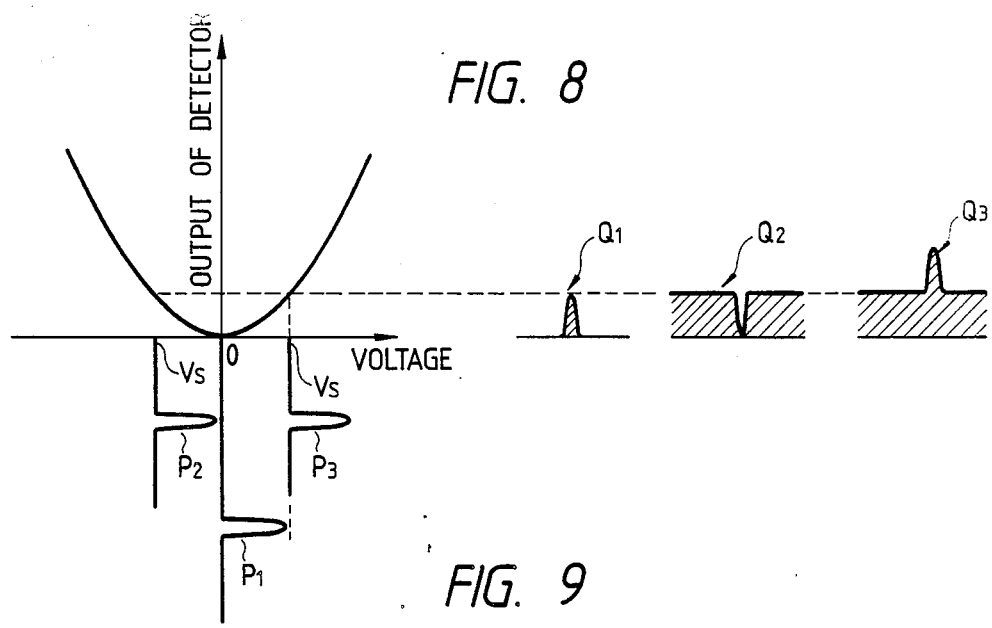
FIG. 8 illustrates how a change in the state of polarization of light beam is detected by a system including the light source and light detecting means shown in FIG. 7.

FIG. 8 shows how a change in the state of polarization of light beam $R_o$ is detected by a system including the light source and light detecting means shown in FIG. 7. In the example shown in FIG. 8, the bias point of the electro-optic material 2 is selected at zero or in its neighborhood. In other words, when the voltage $V_s$ from the voltage applying unit 7 is "zero", the pulse voltage at the electrode 71 (81) on the object 70 (80) is applied to the electro-optic material 2 as shown by $P_1$ in which the bias point "0" is made a reference point, and the waveform that is observed on the high-speed light response detector 38 is indicated by $Q_1$. When the voltage $V_s$ is increased from "zero" and if it becomes equal to the maximum value $V_o$ of the pulse voltage, the latter will be applied to the electro-optic material 2 as shown by $P_2$ in which the bias point "$V_s$" is made a reference point, and the waveform that is observed on the high-speed light response detector 38 is indicated by $Q_2$. The waveform $Q_2$ is not zero except at its peak and by detecting the voltage $V_s$ which occurs when such a waveform is observed, the absolute voltage $V_o$, or the maximum value of the pulse voltage, can be determined. The system shown in FIG. 7 is also capable of determining the absolute voltage $V_o$ even if the voltage $V_s$ of opposite polarity, i.e., the polarity that increases the field strength in the electro-optic material 2, is applied to the auxiliary electrode 5 (12) from the voltage applying unit 7. In this case, the voltage $V_s$ is adjusted in such a way that the intensity at the reference point of waveform when $V_s$ is applied will be equal to the peak intensity of waveform $Q_1$ when $V_s$ is not applied, as indicated by $P_3$ and $Q_3$ in FIG. 8. By detecting the relevant value of $V_s$, the absolute voltage $V_o$ can be determined. If desired, the CW light source 33 shown in FIG. 7 may be replaced by a pulse light source.

Figure 11:
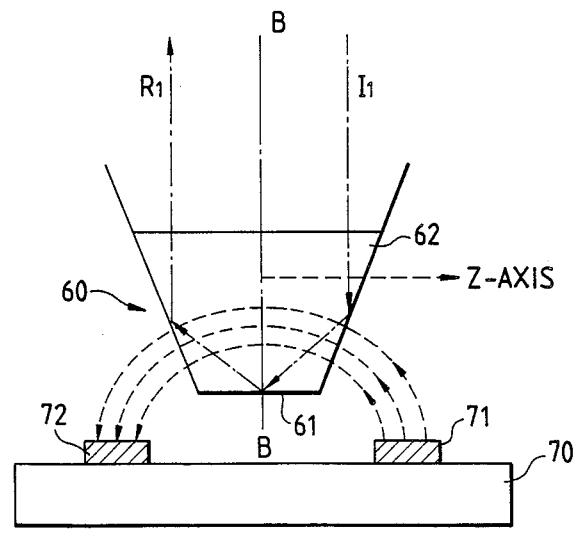

In each of the embodiments described above, the light beam $I_o$ is launched into the optical probe 1 (11) and the light beam $R_o$ is allowed to emerge from the probe along its central axial line A—A, and this is why the total reflecting mirror 4 is furnished at the bottom end face 2b of the electro-optic material 2, as shown in FIGS. 1–4. However, the mirror 4 may be omitted if the incident light beam $I_o$ is allowed to emerge from the optical probe 1 (11) after three total internal reflections as in the case shown in FIG. 11. The light beam $I_o$ to be launched into the optical probe 1 (11) may be condensed to attain improved spatial resolution. No light condensation may be performed if high spatial resolution is not necessary.

In each of the embodiments described above, the inside surface of the optical probe 1 (11) and the individual optical elements of unit 10 are preferably furnished with an anti-reflection coating in order to prevent unwanted reflection and scattering of light beams. This is effective in improving the extinction ratio of the optical modulator composed of the optical probe 1 (11) and the unit 10, thereby reducing the optical bias by a sufficient amount to attain high modulation degree. Another advantage of the anti-reflection coating is that it prevents multiple reflection to assure high-precision measurements by suppressing the production of differently polarized light.

Figure 9:
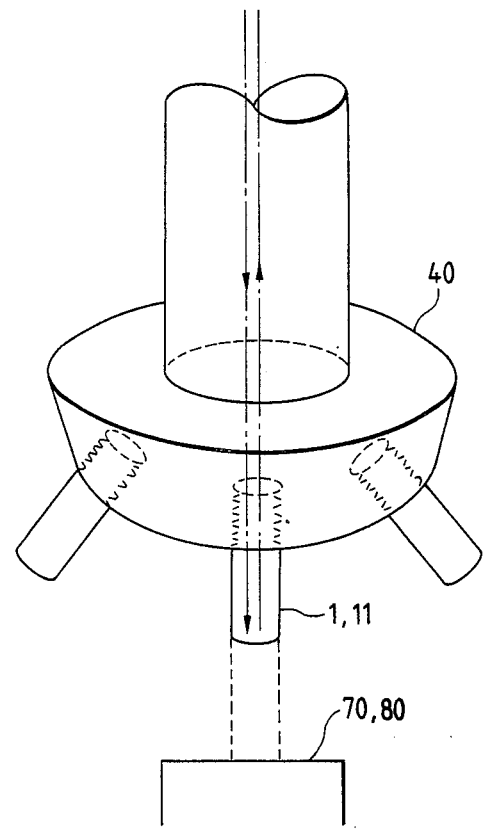
FIG. 9 shows optical probes mounted detachably on a free rotating holder.
Figure 10:
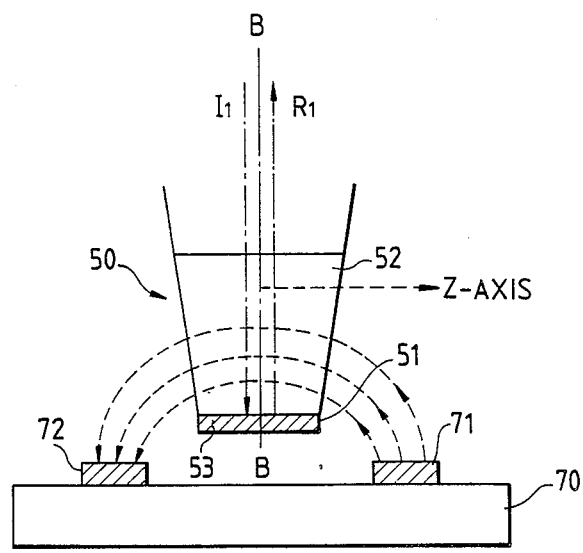
FIGS. 10 and 11 show the principles of voltage measurement by the prior art method.

In each of the embodiments described above, the optical probe 1 (11) may be detachably mounted on a free rotating holder 40 as shown in FIG. 9. This allows a plurality of probe to be mounted on the single holder 40 and probe change can be readily done by rotating the holder 40.

The inside surface of the optical probe 1 (11) may be coated with black paint in order to prevent unwanted scattering of light.

As described on the foregoing pages, the apparatus of the present invention varies the voltage being applied to an auxiliary electrode on an optical probe and detects with light detecting means the resulting change in the state of polarization of a light beam that emerges from the electro-optic material in the optical probe. Thus, the absolute voltage at a specified part of an object of interest can be measured by detecting the voltage being applied to the auxiliary electrode at the time when the change in the state of polarization of the output light beam becomes no longer detectable.

What is claimed is:

1. A voltage measuring apparatus for measuring a first voltage developing in a given part of an object, comprising:
   an optical prove comprising an electro-optic material for sensing said first voltage as a change in its refractive index, and an auxiliary electrode for terminating electric lines of force coming from said given part;
   a light source for producing a light beam to be supplied to said electro-optic material, said light beam to be supplied having a first polarization state;
   light detecting means for detecting a change between the first polarization state of said light beam to be supplied and a second polarization state of an output light beam from said electro-optic material; and
   means for applying and varying a second voltage to said auxiliary electrode to provide that said light detecting means does not detect a change between the first polarization state of said light beam to be supplied and the second polarization state of the output light beam from said electro-optic material; whereby said second voltage is equal to an absolute voltage in said given part.

2. A voltage measuring apparatus as claimed in claim 1, wherein said auxiliary electrode is transparent and is disposed on a face of said electro-optic material which is opposed to a tip face of said electro-optic material.

3. A voltage measuring apparatus as claimed in claim 1, wherein said auxiliary electrode is disposed on a lateral side of said optical probe which is in proximity to a top face of said electro-optic material.

4. A voltage measuring apparatus as claimed in claim 1, wherein said light source is a pulse light source for producing a pulse light beam, and said light detecting means samples said second polarization state of said output light beam.

5. A voltage measuring apparatus as claimed in claim 4, further comprising delay means for adjusting timing between voltage development in said given part and light incident on said optical probe.

6. A voltage measuring apparatus as claimed in claim 1, wherein said light source is a CW light source for producing a CW light beam or a pulse light source for producing a pulse light beam, and said light detecting means is a high-speed light response detector.

7. A voltage measuring apparatus as claimed in claim 1, wherein said voltage applying means comprises a power source for producing said variable voltage, and a voltmeter for measuring said variable voltage.

8. A method employing an electro-optic material having an auxiliary electrode for measuring a first voltage developing in a given part of an object comprising the steps of:

producing a light beam to be supplied into the electro-optic material, said electro-optic material sensing said first voltage as a change in its refractive index;

detecting a change between a polarization state of said light beam to be input and a polarization state of an output light beam from said electro-optic material;

applying a second voltage of zero volts to the auxiliary electrode within close proximity of said electro-optic material;

increasing said second voltage until a change between the polarization state of said light beam to be supplied and the polarization state of the output light beam from said electro-optic material is not detected;

transmitting the final value of the increased second voltage as the detected first voltage developed in said given part.

9. The method according to claim 8 further comprising the step of pulsing said light beam to be supplied.

10. The method according to claim 9 further comprising the step of adjusting timing between voltage development in said given part and said light beam to be supplied.

* * * * *

UNITED STATES PATENT AND TRADEMARK OFFICE
CERTIFICATE OF CORRECTION

PATENT NO. : 4,982,151
DATED : January 01, 1991
INVENTOR(S) : Hironori Takahashi et al.

It is certified that error appears in the above-identified patent and that said Letters Patent is hereby corrected as shown below:

Title page, Title, change "VOLTAGE MEASURING APPARATUS" to --ELECTRO-OPTICAL ABSOLUTE VOLTAGE-MEASURING APPARATUS--;

Claim 1, column 8, line 50, change "prove" to --probe--;

Claim 7, column 9, line 29, change "variable" to --second--.

Signed and Sealed this

Twenty-third Day of February, 1993

*Attest:*

STEPHEN G. KUNIN

*Attesting Officer*   Acting Commissioner of Patents and Trademarks